(12) United States Patent
Shirai (10) Patent No.: US 10,167,570 B2
(45) Date of Patent: Jan. 1, 2019

(54) N-TYPE SIC SINGLE CRYSTAL AND METHOD FOR ITS PRODUCTION

(71) Applicant: TOYOTA JIDOSHA KABUSHIKI KAISHA, Toyota-shi, Aichi (JP)

(72) Inventor: Takayuki Shirai, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 230 days.

(21) Appl. No.: 14/914,823

(22) PCT Filed: Jul. 23, 2014

(86) PCT No.: PCT/JP2014/069444
§ 371 (c)(1),
(2) Date: Feb. 26, 2016

(87) PCT Pub. No.: WO2015/029649
PCT Pub. Date: Mar. 5, 2015

(65) Prior Publication Data
US 2016/0208411 A1    Jul. 21, 2016

(30) Foreign Application Priority Data
Aug. 30, 2013   (JP) .................................. 2013-179669

(51) Int. Cl.
| | | |
|---|---|---|
| *C30B 23/00* | (2006.01) |
| *C30B 29/36* | (2006.01) |
| *C30B 29/66* | (2006.01) |
| *C30B 19/04* | (2006.01) |
| *C30B 9/10* | (2006.01) |
| *C30B 17/00* | (2006.01) |
| *C30B 19/06* | (2006.01) |
| *C30B 19/12* | (2006.01) |

(52) U.S. Cl.
CPC ................ *C30B 19/04* (2013.01); *C30B 9/10* (2013.01); *C30B 17/00* (2013.01); *C30B 19/067* (2013.01); *C30B 29/36* (2013.01); *C30B 19/062* (2013.01); *C30B 19/12* (2013.01); *C30B 23/00* (2013.01); *C30B 29/66* (2013.01)

(58) Field of Classification Search
CPC .......... C30B 23/00; C30B 29/36; C30B 29/66
See application file for complete search history.

(56) References Cited

U.S. PATENT DOCUMENTS

| | | | |
|---|---|---|---|
| 2011/0297893 A1 | 12/2011 | Seki et al. | |
| 2012/0308758 A1* | 12/2012 | Hori ........................ | C30B 23/00 428/64.1 |
| 2015/0299896 A1 | 10/2015 | Shirai | |

FOREIGN PATENT DOCUMENTS

| | | |
|---|---|---|
| JP | 2007153719 A | 6/2007 |
| JP | 2008105896 A | 5/2008 |
| JP | 2010189235 A | 9/2010 |
| JP | 2011102206 A | 5/2011 |
| WO | 2014/103394 A1 | 7/2014 |

OTHER PUBLICATIONS

JP2007153719 machine translation.*

* cited by examiner

*Primary Examiner* — Haidung D Nguyen
(74) *Attorney, Agent, or Firm* — Oliff PLC (57) ABSTRACT

A n-type SiC single crystal with low resistivity and low threading dislocation density is provided, which is achieved by a n-type SiC single crystal containing germanium and nitrogen, wherein the density ratio of the germanium and the nitrogen [Ge/N] satisfies the relationship $0.17<[Ge/N]<1.60$.

8 Claims, 5 Drawing Sheets

N-TYPE SIC SINGLE CRYSTAL AND METHOD FOR ITS PRODUCTION

TECHNICAL FIELD

The present invention relates to a n-type SiC single crystal that is suitable as a semiconductor element, and to a method for its production.

BACKGROUND ART

SiC single crystals are thermally and chemically very stable, superior in mechanical strength, and resistant to radiation, and also have superior physical properties, such as high breakdown voltage and high thermal conductivity compared to Si single crystals. They are therefore able to exhibit high output, high frequency, voltage resistance and environmental resistance that cannot be realized with existing semiconductor materials, such as Si single crystals and GaAs single crystals, and are considered ever more promising as next-generation semiconductor materials for a wide range of applications including power device materials that allow high power control and energy saving to be achieved, device materials for high-speed large volume information communication, high-temperature device materials for vehicles, radiation-resistant device materials and the like.

Typical growth processes for growing SiC single crystals that are known in the prior art include gas phase processes, the Acheson process and solution processes. Among gas phase processes, for example, sublimation processes have a drawback in that grown single crystals have been prone to hollow penetrating defects known as "micropipe defects", lattice defects, such as stacking faults, and generation of polymorphic crystals. However, most SiC bulk single crystals are conventionally produced by sublimation processes because of the high crystal growth rate, with attempts being made to reduce defects in the grown crystals. In the Acheson process, heating is carried out in an electric furnace using silica stone and coke as starting materials, and therefore it has not been possible to obtain single crystals with high crystallinity due to impurities in the starting materials.

Solution processes are processes in which molten Si or an alloy melted in molten Si is situated in a graphite crucible and C is dissolved into the molten liquid, and a SiC crystal layer is deposited and grown on a seed crystal substrate set in the low temperature zone. Solution processes can be expected to reduce defects compared to sublimation processes, since crystal growth is carried out in a state of near thermal equilibrium, compared to gas phase methods. In recent years, therefore, several processes for producing SiC single crystals by solution processes have been proposed, and methods for obtaining SiC single crystals with few crystal defects have also been proposed (PTL 1).

It has also been attempted to obtain SiC single crystals with low volume resistivity (hereunder referred to as "resistivity") in order to reduce electric power loss when such SiC single crystals are to be applied in electronic devices, such as power devices. For example, in order to lower the resistivity of a SiC single crystal, it has been proposed to grow a n-type SiC single crystal with low resistivity by using a solution process in which the SiC single crystal is doped with a n-type dopant by supplying nitrogen gas into the crucible or adsorbing nitrogen onto the crucible, etc. (PTLs 2 to 4).

CITATION LIST

Patent Literature

[PTL 1] Japanese Unexamined Patent Publication No. 2008-105896
[PTL 2] Japanese Unexamined Patent Publication No. 2010-189235
[PTL 3] Japanese Unexamined Patent Publication No. 2007-153719
[PTL 4] Japanese Unexamined Patent Publication No. 2011-102206

SUMMARY OF THE INVENTION

Problems to be Solved by the Invention

Attempts have thus been made to obtain high-quality SiC single crystals using solution processes, but efforts to obtain a nitrogen-doped n-type SiC single crystal by a solution process as in PTL 2 have been associated with the problem of a tendency toward greater threading dislocation in the grown crystals.

The present invention has been accomplished in light of the above circumstances, and its object is to provide a n-type SiC single crystal with low resistivity and a low threading dislocation density.

Means for Solving the Problems

The present invention is a n-type SiC single crystal containing germanium and nitrogen, wherein the density ratio of the germanium and the nitrogen [Ge/N] satisfies the relationship $0.17<[Ge/N]<1.60$.

The invention is also a method for producing a n-type SiC single crystal in which a SiC seed crystal substrate is contacted with a Si—C solution having a temperature gradient such that the temperature decreases from the interior toward the surface, to cause crystal growth of a n-type SiC single crystal, wherein the method comprises:

adding a nitride and germanium metal to a starting material used to form the Si—C solution, or to the Si—C solution, and growing a n-type SiC single crystal containing germanium and nitrogen, and wherein the density ratio of the germanium and the nitrogen [Ge/N] in the grown SiC single crystal satisfies the relationship $0.17<[Ge/N]<1.60$.

Effect of the Invention

According to the invention, it is possible to obtain a n-type SiC single crystal with low resistivity and low threading dislocation density.

DESCRIPTION OF EMBODIMENTS

As mentioned above, methods have been proposed in the prior art for growing a n-type SiC single crystal doped with nitrogen by a solution process, wherein nitrogen is supplied to a Si—C solution by, for example, adding nitrogen gas to the atmosphere in the growth furnace or adsorbing nitrogen onto the crucible.

However, when it has been attempted to obtain nitrogen-doped n-type SiC single crystals by prior art methods, greatly increased threading dislocation density of the grown crystal has been a problem.

The cause of numerous threading dislocations in a nitrogen-doped n-type SiC single crystal is possibly because high density doping of nitrogen decreases the lattice constant of the SiC single crystal, producing misfits of the lattice constant at the seed crystal/grown crystal interface, such that new threading dislocations are generated in the grown crystal in addition to the threading dislocations due to the seed crystal.

Threading dislocations are classified as threading screw dislocations, threading edge dislocations or micropipe defects. In the case of c-face growth of a SiC single crystal by a solution process, threading dislocations in the seed crystal substrate tend to propagate in the c-axis direction, i.e., the growth direction. In addition, doping with nitrogen results in generation of new threading edge dislocations due to lattice constant misfits at the seed crystal/grown crystal interface, causing numerous threading dislocations to be included in the grown crystal. The threading edge dislocations will be referred to hereunder simply as "threading dislocations".

In order to solve these problems, the present inventor has conducted much research and have discovered a n-type SiC single crystal wherein the density ratio of germanium and nitrogen [Ge/N] satisfies the relationship $0.17<[Ge/N]<1.60$.

The present invention relates to a n-type SiC single crystal containing germanium and nitrogen, wherein the density ratio of the germanium and the nitrogen [Ge/N] satisfies the relationship $0.17<[Ge/N]<1.60$.

By doping a nitrogen-doped SiC grown crystal with a prescribed amount of germanium, it is possible to enlarge the lattice constant of the grown crystal and reduce or eliminate misfits of the lattice constant at the seed crystal substrate/nitrogen-doped grown crystal interface.

Atoms that enlarge the lattice constant of SiC grown crystals include, in addition to germanium, the Group 14 elements Sn and Pb, which have little electrical effect on nitrogen-doped n-type SiC single crystals. Germanium is preferred from the viewpoint of solid solution in the n-type SiC single crystal and environmental safety.

The nitrogen density [N] in the n-type SiC single crystal of the invention is preferably in a range of $1\times10^{19}/cm^3 \leq [N] \leq 1\times10^{20}/cm^3$. In order to obtain the desired low resistivity as a n-type SiC single crystal, the n-type SiC single crystal preferably has a nitrogen density of $1\times10^{19}/cm^3$ or greater, and the upper limit for the nitrogen density in the n-type SiC single crystal is preferably about $1\times10^{20}/cm^3$, due to the solubility limit of nitrogen in the SiC single crystal, and for polytype stability.

The lower limit for the germanium density [Ge] in the n-type SiC single crystal of the invention is preferably greater than $1.70\times10^{18}/cm^3$, and more preferably $2.40\times10^{18}/cm^3$ or greater. The upper limit for the germanium density [Ge] in the n-type SiC single crystal of the invention is preferably less than $1.60\times10^{20}/cm^3$, and more preferably $8.30\times10^{19}/cm^3$ or lower. If the germanium density [Ge] is within the above range, then it will be possible to obtain the desired low resistivity as a n-type SiC single crystal, while more stably obtaining a n-type SiC single crystal with low generation of threading dislocations.

The SiC single crystal of the invention contains substantially no miscellaneous crystals. It can be easily determined whether or not miscellaneous crystals are present in the SiC single crystal, by external observation or microscopy.

The SiC single crystal of the invention is a n-type SiC single crystal with low resistivity, having resistivity of preferably 10 mΩ·cm or lower, more preferably 8 mΩ·cm or lower, even more preferably 6 mΩ·cm or lower and yet more preferably 5 mΩ·cm or lower. A lower resistivity of the SiC single crystal is preferred, but the lower limit for the resistivity is about 1 mΩ·cm, due to the solubility limit of nitrogen in SiC crystals.

The resistivity of the SiC single crystal can be measured by Hall measurement using the Van der Pauw method.

The threading dislocation density in the grown crystal can be evaluated by mirror polishing so as to expose the (0001) plane of the grown crystal, performing molten alkali etching using a molten salt, such as molten potassium hydroxide or sodium peroxide, to accentuate the dislocations, and observing the etch pits on the etching surface with a microscope. Throughout the present specification, the indication "−1" in an expression such as "(000-1) plane" is used where normally a transverse line is placed over the numeral.

An etch pit corresponding to a threading edge dislocation generally has a diameter of several tens of μm, depending on the etching conditions. Also, since etch pits corresponding to threading screw dislocations are larger than etch pits corresponding to threading edge dislocations, and etch pits corresponding to micropipe defects are even larger with diameters of several hundred μm, these can be distinguished in the measurement. Observation and measurement of the etch pits may be carried out by using a microscope.

The nitrogen density and germanium density in the SiC single crystal can be measured by using secondary ion mass spectrometry (SIMS).

The invention is also a method for producing a n-type SiC single crystal in which a SiC seed crystal substrate is contacted with a Si—C solution having a temperature gradient such that the temperature decreases from the interior toward the surface, to cause crystal growth of a n-type SiC single crystal, wherein the method comprises adding a nitride and germanium metal to a starting material used to form the Si—C solution, or to the Si—C solution, and growing a n-type SiC single crystal containing germanium and nitrogen, and wherein the density ratio of the germanium and the nitrogen [Ge/N] in the grown SiC single crystal satisfies the relationship $0.17<[Ge/N]<1.60$.

According to the method of the invention, it is possible to obtain a n-type SiC single crystal grown at a rapid rate and having low resistivity, and also having low threading dislocation density.

In conventional methods of supplying nitrogen gas, since nitrogen dissolves from the gas phase in the growth furnace into the liquid phase, a high-nitrogen-concentration region forms on the surface of the Si—C solution. When the temperature gradient on the surface of the Si—C solution is increased to speed the growth rate, miscellaneous crystals are generated in the high-nitrogen-concentration region, and the generated miscellaneous crystals adhere onto the growth surface of the grown crystal, resulting in the problem of inhibited growth of the SiC single crystal. In addition, when nitrogen adsorbed onto a crucible is used as the doping source, it has been difficult to stably control the amount of nitrogen doping in the single crystal.

According to the method of the invention, by directly adding a nitride to the starting material for formation of the Si—C solution, or to the Si—C solution, it is possible to form a substantially uniform nitrogen concentration in the Si—C solution and to inhibit formation of a high-nitrogen-concentration region on the surface of the Si—C solution. This makes it is possible to obtain a n-type SiC single crystal without miscellaneous crystals, and having low resistivity and low threading dislocation density, even when grown at a rapid rate.

It can be easily determined whether or not a SiC single crystal has been obtained, by carrying out external observation or microscopy to observe whether or not miscellaneous crystals are present in the grown crystal.

The nitride and germanium metal to be used in the method of the invention may be added to the starting material for forming a Si—C solution before melting, or may be added to the Si—C solution. The added nitride and germanium metal may be mixed with the starting material for forming a Si—C solution or with the Si—C solution, forming a solvent for a Si—C solution containing nitrogen and germanium.

The nitride to be used in the method of the invention is a nitride that exhibits a liquid phase in the Si—C solution. The nitride that exhibits a liquid phase in the Si—C solution does not necessarily need to be a nitride with a melting point below the temperature of the Si—C solution, and it may be one such that at least a portion of the nitride, and preferably substantially all of the nitride exhibits a liquid phase in the molten Si—C liquid.

The nitride to be used in the method of the invention is preferably a metal nitride that is solid at ordinary temperature, more preferably a compound of nitrogen and a transition element, such as Cr, Ti or Ni, a compound of nitrogen and a typical element, such as Ge, a compound of nitrogen and a non-metal element, such as Si, or a mixture thereof, even more preferably a compound of nitrogen and an element of Group 14, such as Si or Ge, or a compound of nitrogen and an element of period 4, such as Cr or Ge, and examples include chromium nitride ($Cr_2N$ and/or $CrN$), silicon nitride ($Si_3N_4$), germanium nitride ($Ge_3N_4$), titanium nitride ($TiN$ and/or $Ti_2N$), nickel nitride ($Ni_4N$ and/or $Ni_3N$), and mixtures thereof.

The nitride used in the method of the invention is preferably chromium nitride ($Cr_2N$ and/or $CrN$), silicon nitride ($Si_3N_4$) or germanium nitride ($Ge_3N_4$), more preferably chromium nitride ($Cr_2N$ and/or $CrN$) or germanium nitride ($Ge_3N_4$), and even more preferably chromium nitride ($Cr_2N$ and/or $CrN$). The nitride may include compounds with different valencies, other than those mentioned.

In the method of the invention, the nitride may be added to the starting material for formation of the Si—C solution, or to the Si—C solution, so that the grown crystal has the prescribed nitrogen density. The amount of nitride added is preferably 0.12 at % or greater, more preferably 0.15 at % or greater, even more preferably 0.22 at % or greater and yet more preferably 0.30 at % or greater, in terms of nitrogen atoms based on the total amount of the Si—C solution containing nitrogen and germanium. If the amount of nitride added is within the above range, it will be possible to obtain a grown crystal having the prescribed low resistivity, as a n-type SiC single crystal.

There are no particular restrictions on the upper limit for the amount of nitride added, but it may be no greater than 1.0 at % in terms of nitrogen atoms based on the total amount of the Si—C solution containing nitrogen. If nitrogen is dissolved in the Si—C solution at 1.0 at %, the desired 4H—SiC may not be stably obtained.

By adding such an amount of nitride to the starting material for formation of the Si—C solution or to the Si—C solution, the nitrogen density [N] in the grown crystal can be adjusted within the range of $1\times10^{19}/cm^3 \leq [N] \leq 1\times10^{20}/cm^3$.

When determining the amount of nitride to be added, the nitrogen density in the grown crystal due to the crucible or atmosphere may also be considered. However, the nitrogen density in the grown crystal due to the crucible or atmosphere has a small effect, being about 1/10 to 1/100 of the nitrogen density in the grown crystal due to the nitride used in the method of the invention.

In the method of the invention, the germanium metal may be added to the starting material for formation of the Si—C solution, or to the Si—C solution, so that the grown crystal has the prescribed nitrogen density and germanium density. The lower limit for the amount of germanium metal added is preferably 4.0 at % or greater and more preferably 5.0 at % or greater, based on the total amount of the Si—C solution containing nitrogen and germanium. The upper limit for the amount of germanium metal added is preferably less than 20.0 at % and more preferably no greater than 10.0 at %, based on the total amount of the Si—C solution containing nitrogen and germanium. If the amount of germanium metal added is within the above range, it will be possible to more stably reduce generation of threading dislocations in the n-type SiC single crystal that is to be grown.

More specifically, by adding germanium metal to the starting material for formation of the Si—C solution or to the Si—C solution in the amount specified above, it will be easier for the lower limit for the density ratio of germanium and nitrogen [Ge/N] in the grown crystal to be greater than 0.17 and preferably 0.24 or greater, and for the upper limit for the density ratio of germanium and nitrogen [Ge/N] in the grown crystal to be less than 1.60 and preferably no greater than 0.83.

When germanium nitride is used as the nitride, adjustment may be made so that the total amount of germanium in the germanium nitride and germanium metal is in the addition range specified above.

The germanium metal is preferably simple germanium, but it may partly include germanium compounds, such as germanium nitride and germanium oxide.

In the method of the invention, the average temperature gradient in which the temperature falls from the interior of the solution toward the surface of the solution in a range of 1 cm from the surface of the Si—C solution is preferably 20° C./cm or greater, more preferably 30° C./cm or greater and even more preferably 42° C./cm or greater, to allow growth of a n-type SiC single crystal having low resistivity and low threading dislocation density. There is no particular restriction on the upper limit of the temperature gradient, but the temperature gradient that can be actually formed can substantially be the upper limit, and it may be about 60° C./cm, for example.

In the method of the invention, the temperature gradient can be increased as above, thereby allowing the SiC single crystal growth rate to be preferably 100 µm/h or higher, more preferably 150 µm/h or higher, even more preferably 200 µm/h or higher, yet more preferably 300 µm/h or higher, and even yet more preferably 400 µm/h, and for example, a SiC single crystal can be grown at 400 to 500 µm/h. There is no particular restriction on the upper limit for the growth rate of the SiC single crystal, but it will be limited by the upper limit of the temperature gradient that can be formed, and it may be 2000 µm/h or less, for example.

A solution process is used in the method for producing a SiC single crystal according to the invention. A solution process for production of a SiC single crystal is a method in which the surface region of the Si—C solution becomes supersaturated due to formation of a temperature gradient in which the temperature decreases from the interior of the Si—C solution toward the surface of the solution in a crucible, and a SiC single crystal is grown on a seed crystal contacting with the Si—C solution.

In the method of the invention, a SiC single crystal having quality commonly used for production of SiC single crystals may be used as the seed crystal substrate. For example, a SiC single crystal commonly formed by a sublimation process may be used as the seed crystal substrate. A SiC single crystal commonly formed by a sublimation process usually contains numerous threading dislocations, but the seed crystal substrate used for the invention may either contain or not contain threading dislocations.

In the method of the invention, it is possible to obtain a SiC single crystal having the same threading dislocation density level as the seed crystal substrate, and therefore a SiC single crystal having low threading dislocation density or containing no threading dislocations is preferably used as the seed crystal substrate.

The seed crystal substrate to be used for the method may have any desired shape, such as laminar, discoid, cylindrical, square columnar, truncated circular conic or truncated pyramidal.

Placement of the seed crystal substrate in the single crystal production apparatus may be carried out by holding the top face of the seed crystal substrate on the seed crystal holding shaft.

Contact of the seed crystal substrate with the Si—C solution may be carried out by lowering the seed crystal holding shaft that holds the seed crystal substrate toward the Si—C solution surface, and contacting it with the Si—C solution while the bottom face of the seed crystal substrate is parallel to the Si—C solution surface. The seed crystal substrate may be held at a prescribed position relative to the Si—C solution surface for growth of the SiC single crystal.

The holding position of the seed crystal substrate may be such that the position of the bottom face of the seed crystal substrate matches the Si—C solution surface, is below the Si—C solution surface, or is above the Si—C solution surface. When it is held so that the bottom face of the seed crystal substrate is at a position above the Si—C solution surface, the seed crystal substrate is contacted once with the Si—C solution so that the Si—C solution contacts with the bottom face of the seed crystal substrate, and it is then raised to the prescribed position. The position of the bottom face of the seed crystal substrate may match the Si—C solution surface or be lower than the Si—C solution surface, but it is preferable that the Si—C solution does not contact with the seed crystal holding shaft in order to prevent generation of polycrystals. In such methods, the position of the seed crystal substrate may be adjusted during crystal growth.

The seed crystal holding shaft may be a graphite shaft holding the seed crystal substrate at one end face. The seed crystal holding shaft may have any desired shape, such as cylindrical or columnar, and there may be used a graphite shaft having the same end face shape as the top face of the seed crystal substrate.

According to the invention, a Si—C solution is a solution in which C is dissolved, where the solvent is a molten liquid of Si/X (X is one or more metals other than Si), and it further contains nitrogen and germanium. X is not particularly restricted so long as it is one or more metals and can form a liquid phase (solution) that is in a state of thermodynamic equilibrium with SiC (the solid phase). Suitable examples of X metals include Ti, Mn, Cr, Ni, Ce, Co, V and Fe.

The Si—C solution is preferably a molten liquid of Si/Cr/X (where X is one or more metals other than Si and Cr), and it further includes prescribed concentrations of nitrogen and germanium. If the Si—C solution is Si/Cr/X, then the amount of dissolved germanium can be increased. A Si—C solution wherein the solvent is a molten liquid with an atomic composition percentage of Si/Cr/X=30-80/20-60/0-10, can have a greater amount of germanium dissolution and low variation in C dissolution and is therefore more preferred. For example, a starting material of Cr, Ni and the like may be loaded into the crucible in addition to Si, and nitride, such as $Cr_2N$, and germanium metal, may be further added to form a Si/Cr solution, Si/Cr/Ni solution, etc., which contains nitrogen and germanium.

In the method of the invention, the temperature of the Si—C solution is the surface temperature of the Si—C solution. The lower limit for the temperature of the surface of the Si—C solution is preferably 1800° C. or higher and the upper limit is preferably 2200° C., since the C dissolution in the Si—C solution can be increased within this temperature range. The lower limit for the temperature of the surface of the Si—C solution is preferably 2000° C. or higher from the viewpoint of allowing the amount of nitrogen dissolution in the Si—C solution to be increased.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

Figure 1:
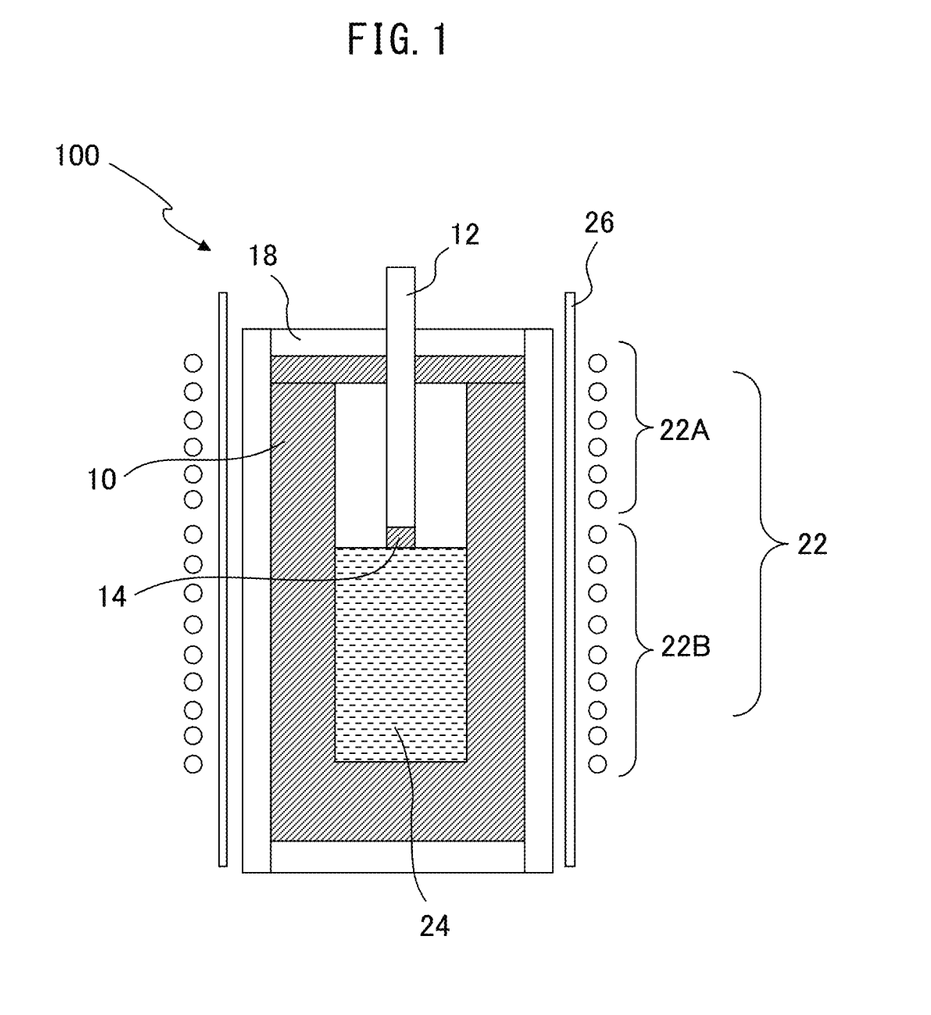
FIG. 1 is a cross-sectional schematic drawing of a single crystal production apparatus based on a solution process, to be used for the invention.

FIG. 1 shows an example of a SiC single crystal production apparatus suitable for carrying out the method of the invention. The illustrated SiC single crystal production apparatus 100 comprises a crucible 10, wherein the crucible 10 receives a Si—C solution 24 having carbon, nitrogen and germanium dissolved in a molten liquid of Si or Si/X, a temperature gradient is formed in which the temperature is decreased from the interior of the Si—C solution 24 toward the surface of the solution, and the seed crystal substrate 14 that is held at the tip of the vertically movable graphite shaft 12 is contacted with the nitrogen-containing Si—C solution 24 to allow growth of the SiC single crystal. The crucible 10 and/or the graphite shaft 12 are preferably rotated.

The Si—C solution 24 is prepared by loading the starting materials, such as Si, Cr and Ni, into the crucible and further adding the nitride and germanium metal, melting them by heating to prepare Si/X molten liquid, and dissolving C therein. Alternatively, the Si—C solution 24 is prepared by loading the starting materials, such as Si, Cr and Ni, into the crucible, melting them by heating to prepare Si/X molten liquid and then adding nitride and germanium metal to the molten liquid to dissolve them, and dissolving C therein.

If the crucible 10 is a carbonaceous crucible, such as a graphite crucible, or SiC crucible, C will dissolve into the molten liquid by dissolution of the crucible 10, thereby forming a nitrogen- and germanium-containing Si—C solution 24. This will avoid the presence of undissolved C in the Si—C solution 24, and prevent waste of SiC due to deposition of the SiC single crystal onto the undissolved C. The supply of C may be carried out by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are housed together inside a quartz tube 26. A high-frequency coil 22 for heating is disposed around the outer periphery of the quartz tube 26. The high-frequency coil 22 may be configured with an upper level coil 22A and a lower level coil 22B. The upper level coil 22A and lower level coil 22B can be independently regulated.

Since the temperatures of the crucible 10, heat-insulating material 18, quartz tube 26 and high-frequency coil 22 become high, they are situated inside a water-cooling chamber. The water-cooling chamber is provided with a gas inlet and a gas exhaust vent to allow atmospheric modification in the apparatus by using Ar, He, $N_2$ or the like.

The temperature of the Si—C solution usually has a temperature distribution with a lower temperature at the surface of the SiC solution than the interior thereof due to thermal radiation and the like. Further, a prescribed temperature gradient can be formed in the Si—C solution 24 in the direction perpendicular to the surface of the Si—C solution 24 so that an upper portion of the solution in which the seed crystal substrate 14 is immersed is at low temperature and a lower portion of the solution is at high temperature, by adjusting the number of coils and spacing of the high-frequency coil 22, the positional relationship of the high-frequency coil 22 and the crucible 10 in the height direction, and the output of the high-frequency coil. For example, the output of the upper level coil 22A may be smaller than the output of the lower level coil 22B, to form a prescribed temperature gradient in the Si—C solution 24 in which an upper portion of the solution is at low temperature and a lower portion of the solution is at high temperature.

The carbon that has dissolved in the Si—C solution 24 is dispersed by diffusion and convection. In the vicinity of the bottom surface of the seed crystal substrate 14, a temperature gradient is formed, in which the temperature is lower compared to a lower portion of the Si—C solution 24, by utilizing the power control of the upper level and lower level of the coil 22, heat radiation from the surface of the Si—C solution, and heat loss through the graphite shaft 12. When the carbon that has dissolved into the lower part of the solution where the temperature and the solubility are high, reaches the region near the bottom face of the seed crystal substrate where the temperature and the solubility are low, a supersaturation state appears and a SiC single crystal is grown on the seed crystal substrate by virtue of supersaturation as a driving force. In the invention, the nitrogen and germanium dissolved in the Si—C solution 24 are also dispersed by diffusion and convection in the same manner as carbon, and are incorporated into the SiC grown crystal.

In the method of the invention, meltback may be carried out in which the surface layer of the SiC seed crystal substrate is dissolved in the Si—C solution and removed, prior to growth of a SiC single crystal. Since the surface layer of the seed crystal substrate on which the SiC single crystal is grown may have an affected layer, such as a dislocation, a natural oxide film, or the like, removal of the same by dissolution prior to growth of a SiC single crystal is effective for growing a high-quality SiC single crystal. Although the thickness of a layer to be removed depends on processed conditions of the surface of a SiC seed crystal substrate, it is preferably approximately 5 to 50 µm for sufficient removal of an affected layer and a natural oxide layer.

The meltback may be carried out by any desired method, and for example, by forming in the Si—C solution a temperature gradient in which the temperature increases from the interior of the Si—C solution toward the surface of the solution, i.e., by forming in the Si—C solution a temperature gradient in a direction opposite to the case of SiC single crystal growth. The temperature gradient in the opposite direction can be formed by regulating the output of the high-frequency coil.

The meltback can also be carried out without forming a temperature gradient in the Si—C solution, by simply immersing the seed crystal substrate in the Si—C solution that has been heated to a temperature higher than the liquidus temperature. In that case, the dissolution rate increases with higher Si—C solution temperature, but control of the amount of dissolution becomes difficult, while a low temperature may also slow the dissolution rate.

In the method of the invention, the seed crystal substrate may be preheated in advance, and then the same is contacted with the Si—C solution. If the seed crystal substrate at a low temperature is contacted with the Si—C solution at high temperature, heat shock dislocations may be generated in the seed crystal substrate. Preheating of the seed crystal substrate before contacting the seed crystal substrate with the Si—C solution prevents heat shock dislocation and is effective for growth of a high-quality SiC single crystal. The seed crystal substrate may be heated together with the graphite shaft. Alternatively, the Si—C solution may be heated to the temperature for crystal growth after contacting the seed crystal with the Si—C solution at a relatively low temperature. This is also effective for preventing heat shock dislocations and growing a high-quality SiC single crystal.

EXAMPLES

Example 1

There was prepared a SiC single crystal formed by a sublimation process, which was a discoid 4H—SiC single crystal with a diameter of 12 mm, a thickness of 700 µm, and the bottom face as the (000-1) plane, for use as a seed crystal substrate. The seed crystal substrate had a resistivity of 20 mΩ·cm and a threading dislocation density of $7 \times 10^3/cm^2$. The top face of the seed crystal substrate was bonded to roughly the center section of the end face of a cylindrical graphite shaft, using a graphite adhesive.

Measurement of the threading dislocation density was carried out by mirror polishing the (0001) plane of the crystal, conducting alkali etching using molten KOH and $Na_2O_2$ at 510° C., observing the etching surface with a microscope, and counting the number of etch pits. The threading dislocation densities measured in the following examples and comparative examples are the values measured based on all of the observed etch pits.

A single crystal production apparatus as shown in FIG. 1 was used, Si/Cr/Ni with an atomic composition of 5:4:1 was loaded in a graphite crucible for holding of the Si—C solution, as a molten liquid starting material for formation of the Si—C solution, and $Cr_2N$ powder (3N by Mitsuwa Chemicals Co., Ltd.) as a nitride for the donor starting material and germanium metal powder (5N by Kojundo Chemical Lab. Co., Ltd.) were each further added so that a nitrogen atom content is 0.50 at % and a germanium content is 5.0 at %, with respect to the total amount of the Si—C solution containing nitrogen and germanium.

After vacuum suction of the interior of the single crystal production apparatus to $1\times10^{-3}$ Pa, argon gas was introduced to 1 atmosphere and the air inside the single crystal production apparatus was exchanged with argon. The high-frequency coil was electrified to melt the starting material in the graphite crucible by heating, thereby forming a Si/Cr/Ni alloy molten liquid containing nitrogen and germanium. Then, a sufficient amount of C was dissolved into the nitrogen- and germanium-containing Si/Cr/Ni alloy molten liquid from the graphite crucible to form a Si—C solution.

The outputs of the upper level coil and lower level coil were adjusted to heat the graphite crucible and were regulated so that the temperature on the surface of the Si—C solution was increased to 2100° C., and a temperature gradient, in which the temperature decreased from the solution interior in a range of 10 mm from the solution surface toward the solution surface, was 42° C./cm. Temperature measurement of the surface of the Si—C solution was carried out with a radiation thermometer, and measurement of the temperature gradient of the Si—C solution was carried out by using a vertically movable thermocouple.

Seed touching was conducted, in which the position of the bottom face of the seed crystal substrate was placed at a position matching the liquid surface of the Si—C solution, and the bottom face of the seed crystal substrate was contacted with the Si—C solution, while keeping the bottom face of the seed crystal substrate bonded to the graphite shaft in parallel to the Si—C solution surface. The graphite shaft was then raised 1.5 mm to prevent the Si—C solution from seeping upward and contacting the graphite shaft, and was held at that position for 10 hours for growth of a crystal.

Upon completion of the crystal growth, the graphite shaft was raised and the seed crystal substrate and the SiC crystal grown from the seed crystal substrate were severed from the Si—C solution and the graphite shaft and were collected. The obtained grown crystal had a diameter of 12 mm and a thickness of 4.0 mm, and the growth rate was 400 μm/h.

Figure 2:
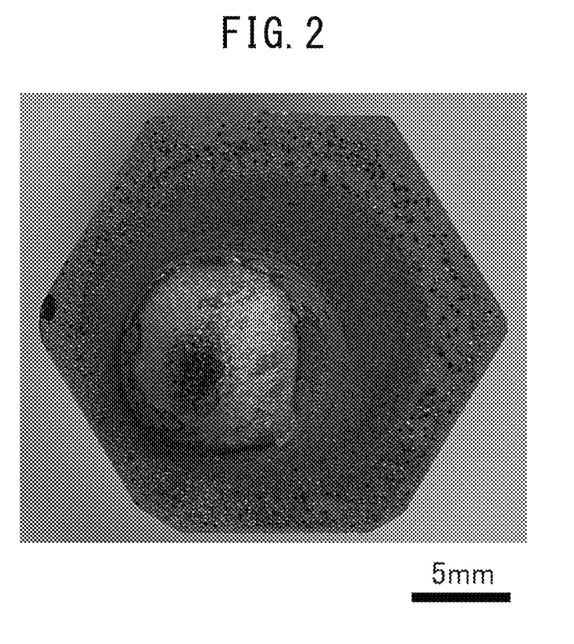
FIG. 2 is an external photograph of a grown crystal according to the invention, as observed from the (000-1) plane as the growth surface.

FIG. 2 shows a photograph of the obtained grown crystal observed from the growth surface. The grown crystal was a SiC single crystal, with no miscellaneous crystals.

Figure 3:
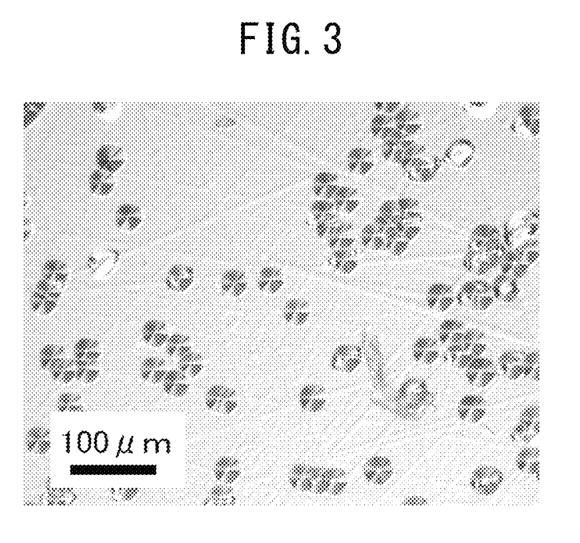
FIG. 3 is a photomicrograph of the etching surface of a SiC single crystal grown in the example.

In order to measure the threading dislocation density of the obtained grown crystal, the grown crystal portion was cut out from the seed crystal substrate, the (0001) plane of the grown crystal was subjected to mirror polishing, and alkali etching was conducted by using molten KOH and $Na_2O_2$ at 510° C. The etching surface was observed with a microscope. FIG. 3 shows a photomicrograph of the etching surface. The number of etch pits seen in FIG. 3 were counted, and the threading dislocation density of the grown crystal was measured.

The threading dislocation density of the grown crystal was $7\times10^3/cm^2$, which was the same as the threading dislocation density of the seed crystal substrate, confirming no creation of new threading dislocations. The etch pits seen in FIG. 3 are threading dislocations originating from the seed crystal.

In order to measure the resistivity of the obtained grown crystal, the (0001) plane of the grown crystal cut out to a thickness of 0.5 mm from the growth surface was mirror polished, worked to a 5 mm square and cleaned. Then a circular Ni ohmic electrode with a diameter of 1 mm was formed by vacuum vapor deposition on the four corners of the (0001) plane. The electrode-attached grown crystal was used for Hall measurement by the Van der Pauw method at room temperature (25° C.), and measurement of the resistivity of the grown crystal revealed a resistivity of 5 mΩ·cm, indicating that a n-type SiC single crystal had been obtained.

The nitrogen density and germanium density in the SiC grown crystal were measured by using secondary ion mass spectrometry (SIMS, Cameca). The reference sample used was a sample comprising N and Ge ion implanted into a SiC substrate. For the grown crystal, the nitrogen density was $5.0\times10^{19}/cm^3$, the germanium density was $1.2\times10^{19}/cm^3$, and the density ratio of germanium and nitrogen [Ge/N] was 0.24.

Example 2

Crystal growth was carried out by the same method as Example 1, except that, with respect to the total amount of the Si—C solution containing nitrogen and germanium, $Cr_2N$ powder was added as a nitride for the donor starting material, in an amount for a nitrogen atom content of 0.22 at %, and the germanium metal powder was added to 5.0 at %. The grown SiC crystal was then collected.

External observation of the growth surface, measurement of the threading dislocation density, measurement of the resistivity, and measurement of the nitrogen density and germanium density, were conducted in the same manner as Example 1. The obtained grown crystal had a diameter of 12 mm and a thickness of 4.0 mm, the growth rate was 400 μm/h, and the grown crystal was a SiC single crystal containing no miscellaneous crystals. The threading dislocation density of the grown crystal was $7\times10^3/cm^2$, which was the same as the threading dislocation density of the seed crystal substrate. For the grown crystal, the resistivity was 8 mΩ·cm, the nitrogen density was $2.2\times10^{19}/cm^3$, the germanium density was $1.2\times10^{19}/cm^3$, and the density ratio of germanium and nitrogen [Ge/N] was 0.55.

Example 3

Crystal growth was carried out by the same method as Example 1, except that, with respect to the total amount of the Si—C solution containing nitrogen and germanium, $Cr_2N$ powder was added as a nitride for the donor starting material, in an amount for a nitrogen atom content of 0.30 at %, and the germanium metal powder was added to 10.0 at %. The grown SiC crystal was then collected.

External observation of the growth surface, measurement of the threading dislocation density, measurement of the resistivity, and measurement of the nitrogen density and germanium density, were conducted in the same manner as Example 1. The obtained grown crystal had a diameter of 12 mm and a thickness of 4.0 mm, the growth rate was 400 μm/h, and the grown crystal was a SiC single crystal containing no miscellaneous crystals. The threading dislocation density of the grown crystal was $7\times10^3/cm^2$, which was the same as the threading dislocation density of the seed crystal substrate. For the grown crystal, the resistivity was 8 mΩ·cm, the nitrogen density was $3.0\times10^{19}/cm^3$, the germanium density was $2.4\times10^{19}/cm^3$, and the density ratio of germanium and nitrogen [Ge/N] was 0.80.

Example 4

Crystal growth was carried out by the same method as Example 1, except that, with respect to the total amount of the Si—C solution containing nitrogen and germanium, Cr$_2$N powder was added as nitride for the donor starting material, in an amount for a nitrogen atom content of 0.12 at %, and the germanium metal powder was added to 4.0 at %. The grown SiC crystal was then collected.

External observation of the growth surface, measurement of the threading dislocation density, measurement of the resistivity, and measurement of the nitrogen density and germanium density, were conducted in the same manner as Example 1. The obtained grown crystal had a diameter of 12 mm and a thickness of 4.0 mm, the growth rate was 400 μm/h, and the grown crystal was a SiC single crystal containing no miscellaneous crystals. The threading dislocation density of the grown crystal was 7×10$^3$/cm$^2$, which was the same as the threading dislocation density of the seed crystal substrate. For the grown crystal, the resistivity was 10 mΩ·cm, the nitrogen density was 1.2×10$^{19}$/cm$^3$, the germanium density was 1.0×10$^{19}$/cm$^3$ and the density ratio of germanium and nitrogen [Ge/N] was 0.83.

Comparative Example 1

Crystal growth was carried out by the same method as Example 1, except that Cr$_2$N powder was added as nitride in an amount for a nitrogen atom content of 0.15 at % with respect to the total amount of the Si—C solution containing nitrogen, while adding no germanium metal powder. The grown SiC crystal was then collected.

External observation of the growth surface, measurement of the threading dislocation density, measurement of the resistivity, and measurement of nitrogen density, were conducted in the same manner as Example 1. The obtained grown crystal had a diameter of 12 mm and a thickness of 4.0 mm, the growth rate was 400 μm/h, the grown crystal was a SiC single crystal containing no miscellaneous crystals, the nitrogen density of the grown crystal was 1.5×10$^{19}$/cm$^3$, and the resistivity of the grown crystal was 10 mΩ·cm.

Figure 4:
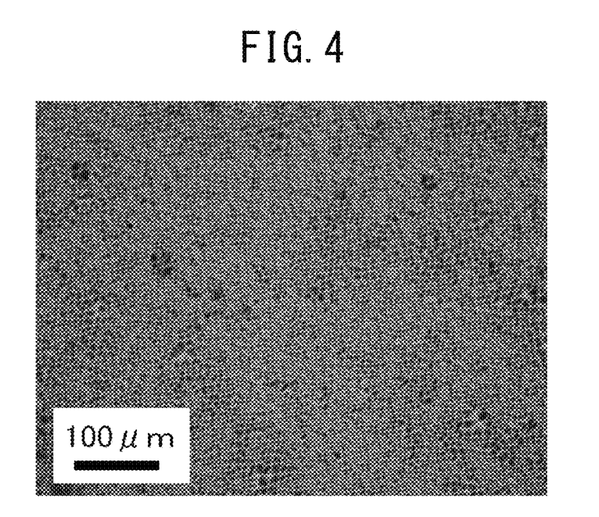
FIG. 4 is a photomicrograph of the etching surface of a SiC single crystal grown in the comparative example.

In order to measure the threading dislocation density of the obtained grown crystal, in the same manner as Example 1, the grown crystal portion was cut out from the seed crystal substrate, the (0001) plane of the grown crystal was subjected to mirror polishing, and alkali etching was conducted by using molten KOH and Na$_2$O$_2$ at 510° C. The etching surface was observed with a microscope. FIG. 4 shows a photomicrograph of the etching surface. The number of etch pits seen in FIG. 4 were counted, and the threading dislocation density of the grown crystal was measured. The threading dislocation density of the grown crystal was approximately 1×10$^6$/cm$^2$, which was a drastic increase in threading dislocation density compared to the threading dislocation density of the seed crystal substrate.

Comparative Example 2

Crystal growth was carried out by the same method as Example 1, except that Cr$_2$N powder was added as a nitride in an amount for a nitrogen atom content of 0.50 at % with respect to the total amount of the Si—C solution containing nitrogen, while adding no germanium metal powder. The grown SiC crystal was then collected.

External observation of the growth surface, measurement of the threading dislocation density, measurement of the resistivity, and measurement of nitrogen density, were conducted in the same manner as Example 1. The obtained grown crystal had a diameter of 12 mm and a thickness of 4.0 mm, the growth rate was 400 μm/h, the grown crystal was a SiC single crystal containing no miscellaneous crystals, the nitrogen density of the grown crystal was 5.0×10$^{19}$/cm$^3$, and the resistivity of the grown crystal was 5 mΩ·cm. However, the threading dislocation density of the grown crystal was approximately 1×10$^6$/cm$^2$, which was a drastic increase in threading dislocation density compared to the threading dislocation density of the seed crystal substrate.

Comparative Example 3

Crystal growth was carried out by the same method as Example 1, except that, with respect to the total amount of the Si—C solution containing nitrogen and germanium, Cr$_2$N powder was added as a nitride for the donor starting material, in an amount for a nitrogen atom content of 0.60 at %, and the germanium metal powder was added to 4.0 at %. The grown SiC crystal was then collected.

External observation of the growth surface, measurement of the threading dislocation density, measurement of the resistivity, and measurement of the nitrogen density and germanium density, were conducted in the same manner as Example 1. The obtained grown crystal had a diameter of 12 mm and a thickness of 4.0 mm, the growth rate was 400 μm/h, and the grown crystal was a SiC single crystal containing no miscellaneous crystals. For the grown crystal, the nitrogen density was 6.0×10$^{19}$/cm$^3$, the germanium density was 1.0×10$^{19}$/cm$^3$, the density ratio of germanium and nitrogen [Ge/N] was 0.17 and the resistivity was 5 mΩ·cm. However, the threading dislocation density of the grown crystal was approximately 1×10$^5$/cm$^2$, which was a drastic increase in threading dislocation density compared to the threading dislocation density of the seed crystal substrate.

Comparative Example 4

Crystal growth was carried out by the same method as Example 1, except that, with respect to the total amount of the Si—C solution containing nitrogen and germanium, Cr$_2$N powder was added as a nitride for the donor starting material, in an amount for a nitrogen atom content of 0.30 at %, and the germanium metal powder was added to 20.0 at %. The grown SiC crystal was then collected.

External observation of the growth surface, measurement of the threading dislocation density, measurement of the resistivity, and measurement of the nitrogen density and germanium density, were conducted in the same manner as Example 1. The obtained grown crystal had a diameter of 12 mm and a thickness of 4.0 mm, the growth rate was 400 μm/h, and the grown crystal was a SiC single crystal containing no miscellaneous crystals. For the grown crystal, the nitrogen density was 3.0×10$^{19}$/cm$^3$, the germanium density was 4.8×10$^{19}$/cm$^3$, the density ratio of germanium and nitrogen [Ge/N] was 1.60 and the resistivity was 8 mΩ·cm. However, the threading dislocation density of the grown crystal was approximately 1×10$^5$/cm$^2$, which was a drastic increase in threading dislocation density compared to the threading dislocation density of the seed crystal substrate.

Comparative Example 5

Crystal growth was carried out by the same method as Example 1, except that Cr$_2$N powder was added as a nitride in an amount for a nitrogen atom content of 0.60 at % with respect to the total amount of the Si—C solution containing nitrogen, while adding no germanium metal powder. The grown SiC crystal was then collected.

External observation of the growth surface, measurement of the threading dislocation density, measurement of the resistivity, and measurement of nitrogen density, were conducted in the same manner as Example 1. The obtained grown crystal had a diameter of 12 mm and a thickness of 4.0 mm, the growth rate was 400 μm/h, the grown crystal was a SiC single crystal containing no miscellaneous crystals, the nitrogen density of the grown crystal was $6.0\times10^{19}/cm^3$, and the resistivity of the grown crystal was 5 mΩ·cm. However, the threading dislocation density of the grown crystal was approximately $1\times10^6/cm^2$, which was a drastic increase in threading dislocation density compared to the threading dislocation density of the seed crystal substrate.

Comparative Example 6

Crystal growth was carried out by the same method as Example 1, except that, with respect to the total amount of the Si—C solution containing nitrogen and germanium, $Ge_3N_4$ powder (3N by Kojundo Chemical Lab. Co., Ltd.) was added as a nitride for the donor starting material, in an amount for a nitrogen atom content of 0.30 at % and a germanium atom content of 0.2 at %, and the temperature gradient was set to 36° C./cm in which the temperature decreased from the interior of the solution toward the surface of the solution in a range of 10 mm from the surface of the solution. The grown SiC crystal was then collected.

External observation of the growth surface, measurement of the threading dislocation density, measurement of the resistivity, and measurement of the nitrogen density and germanium, were conducted in the same manner as Example 1. The obtained grown crystal had a diameter of 12 mm and a thickness of 2.5 mm, the growth rate was 250 μm/h, and the grown crystal was a SiC single crystal containing no miscellaneous crystals. For the grown crystal, the nitrogen density was $3.0\times10^{19}/cm^3$, the germanium density was $5.0\times10^{17}/cm^3$, the density ratio of germanium and nitrogen [Ge/N] was 0.02 and the resistivity was 8 mΩ·cm. However, the threading dislocation density of the grown crystal was approximately $1\times10^6/cm^2$, which was a drastic increase in threading dislocation density compared to the threading dislocation density of the seed crystal substrate.

Comparative Example 7

After vacuum suction of the interior of the single crystal production apparatus to $1\times10^{-3}$ Pa, argon gas and nitrogen gas were introduced to 1 atmosphere and the air inside the single crystal production apparatus was exchanged with a mixed gas of 95 vol % argon and 5 vol % nitrogen. Crystal growth was carried out by the same method as Example 1, except that nitrogen gas was thus used instead of nitride for the donor starting material, forming a Si—C solution without addition of nitride and germanium metal, and the outputs of the upper level coil and lower level coil were regulated so that the temperature gradient was 10° C./cm in which the temperature decreased from the interior of the solution toward the surface of the solution in a range of 10 mm from the surface of the Si—C solution. The average nitrogen concentration in the Si—C solution during this time was 0.30 at % based on the total amount of the Si—C solution containing nitrogen.

Upon completion of the crystal growth, the graphite shaft was raised and the seed crystal substrate and the SiC crystal grown from the seed crystal substrate were severed from the Si—C solution and the graphite shaft and were collected.

Figure 5:
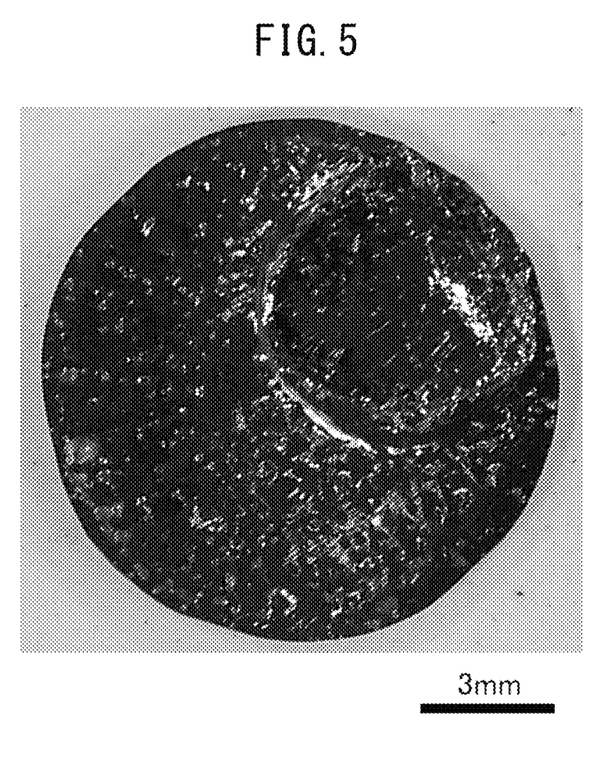
FIG. 5 is an external photograph of a grown crystal grown by a method of the prior art, as observed from the (000-1) plane as the growth surface.

External observation of the growth surface, measurement of the threading dislocation density, measurement of the resistivity, and measurement of nitrogen density were conducted in the same manner as Example 1. FIG. 5 shows a photograph of the obtained grown crystal observed from the growth surface. The obtained grown crystal had a diameter of 12 mm and a thickness of 0.5 mm, and the growth rate was 50 μm/h. The grown crystal was a SiC single crystal containing no miscellaneous crystals, the nitrogen density of the grown crystal was $3.0\times10^{19}/cm^3$, and the resistivity of the grown crystal was 8 mΩ·cm. However, the threading dislocation density of the grown crystal was approximately $1\times10^6/cm^2$, which was a drastic increase in threading dislocation density compared to the threading dislocation density of the seed crystal substrate.

Comparative Example 8

Crystal growth was carried out by the same method as Comparative Example 7, except that the outputs of the upper level coil and lower level coil were regulated so that the temperature gradient was 30° C./cm in which the temperature decreased from the interior of the solution toward the surface of the solution in a range of 10 mm from the surface of the Si—C solution. The grown SiC crystal was then collected.

Figure 6:
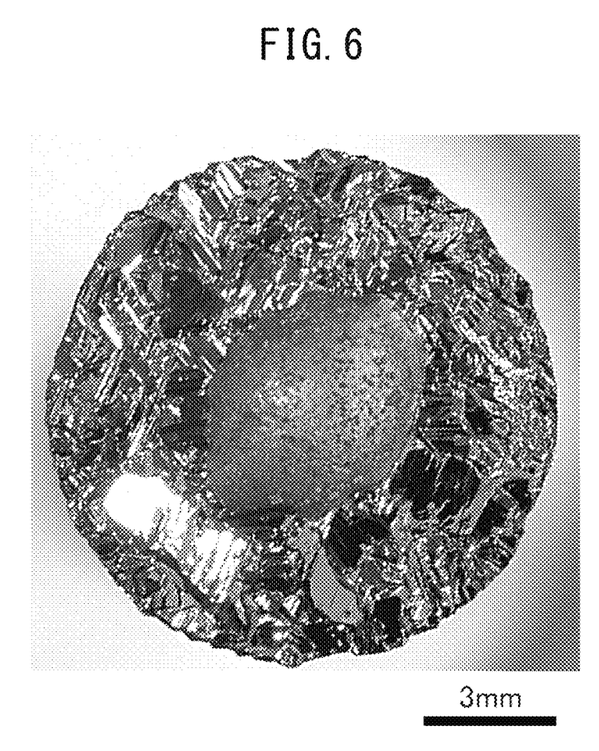
FIG. 6 is an external photograph of a grown crystal grown by a method of the prior art, as observed from the (000-1) plane as the growth surface.

FIG. 6 shows a photograph of the obtained grown crystal observed from the growth surface. The grown crystal contained miscellaneous crystals, and a SiC single crystal could not be obtained.

Table 1 summarizes the growth conditions for Examples 1 to 4 and Comparative Examples 1 to 8. Table 2 summarizes the results for Examples 1 to 4 and Comparative Examples 1 to 8. The generation amount of threading dislocations shown in Table 2 is the density of newly generated threading dislocations in the grown crystal, and it is the value obtained by subtracting the threading dislocation density of the seed crystal substrate from the threading dislocation density of the grown crystal.

TABLE 1

|  | Nitride | Nitrogen concentration in Si—C solution (at %) | Germanium concentration in Si—C solution (at %) | Temperature gradient of Si—C solution (° C./cm) | Growth rate (μm/h) |
| --- | --- | --- | --- | --- | --- |
| Example 1 | Chromium nitride | 0.50 | 5.0 | 42 | 400 |
| Example 2 | Chromium nitride | 0.22 | 5.0 | 42 | 400 |
| Example 3 | Chromium nitride | 0.30 | 10.0 | 42 | 400 |
| Example 4 | Chromium nitride | 0.12 | 4.0 | 42 | 400 |
| Comp. Ex. 1 | Chromium nitride | 0.15 | 0.0 | 42 | 400 |
| Comp. Ex. 2 | Chromium nitride | 0.50 | 0.0 | 42 | 400 |
| Comp. Ex. 3 | Chromium nitride | 0.60 | 4.0 | 42 | 400 |
| Comp. Ex. 4 | Chromium nitride | 0.30 | 20.0 | 42 | 400 |
| Comp. Ex. 5 | Chromium nitride | 0.60 | 0.0 | 42 | 400 |
| Comp. Ex. 6 | Germanium nitride | 0.30 | 0.2 | 36 | 250 |
| Comp. Ex. 7 | Chromium nitride | 0.30 | 0.0 | 10 | 50 |
| Comp. Ex. 8 | Chromium nitride | 0.30 | 0.0 | 30 | — |

TABLE 2

|  | N density ($10^{19}$ atoms/cm$^3$) | Ge density ($10^{19}$ atoms/cm$^3$) | Ge/N | Single crystal growth | Resistivity (mΩ · cm) | Generation amount of threading dislocations (no/cm$^2$) |
|---|---|---|---|---|---|---|
| Example 1 | 5.0 | 1.2 | 0.24 | Yes | 5 | 0 |
| Example 2 | 2.2 | 1.2 | 0.55 | Yes | 8 | 0 |
| Example 3 | 3.0 | 2.4 | 0.80 | Yes | 8 | 0 |
| Example 4 | 1.2 | 1.0 | 0.83 | Yes | 10 | 0 |
| Comp. Ex. 1 | 1.5 | 0.0 | 0.00 | Yes | 10 | $1 \times 10^6$ |
| Comp. Ex. 2 | 5.0 | 0.0 | 0.00 | Yes | 5 | $1 \times 10^6$ |
| Comp. Ex. 3 | 6.0 | 1.0 | 0.17 | Yes | 5 | $1 \times 10^5$ |
| Comp. Ex. 4 | 3.0 | 4.8 | 1.60 | Yes | 8 | $1 \times 10^5$ |
| Comp. Ex. 5 | 6.0 | 0.0 | 0.00 | Yes | 5 | $1 \times 10^6$ |
| Comp. Ex. 6 | 3.0 | 0.05 | 0.02 | Yes | 8 | $1 \times 10^6$ |
| Comp. Ex. 7 | 3.0 | 0.0 | 0.00 | Yes | 8 | $1 \times 10^6$ |
| Comp. Ex. 8 | — | — | — | No | — | — |

Figure 7:
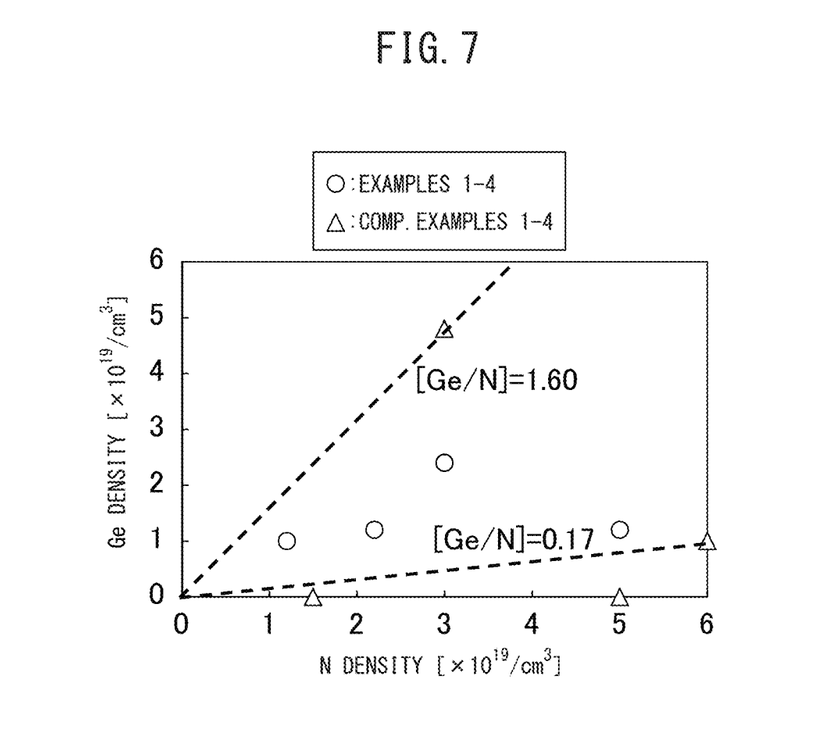
FIG. 7 is a graph showing the relationship between nitrogen density and germanium density and occurrence of new threading dislocations in a grown crystal.

FIG. 7 is a graph showing the relationship between nitrogen density and germanium density, and presence of newly generated threading dislocations, for the grown crystals obtained in Examples 1 to 4 and Comparative Examples 1 to 4.

When nitrogen gas was used as the donor starting material, a single crystal could not be obtained when the growth rate was increased. When a nitride was used as the donor starting material, a n-type SiC single crystal with low resistivity was obtained at a high growth rate. When a nitride and germanium metal were added in the prescribed amounts, a n-type SiC single crystal was obtained with a high growth rate, having low resistivity and having threading dislocation density equivalent to the seed crystal substrate.

EXPLANATION OF SYMBOLS

100 Single crystal production apparatus
10 Graphite crucible
12 Graphite shaft
14 Seed crystal substrate
18 Heat-insulating material
22 High-frequency coil
22A Upper level high-frequency coil
22B Lower level high-frequency coil
24 Si—C solution
26 Quartz tube

What is claimed is:

1. A n-type SiC single crystal, which is grown on a SiC seed crystal substrate, the n-type SiC single crystal comprising germanium and nitrogen, wherein the density ratio of the germanium and the nitrogen [Ge/N] satisfies the relationship $0.24 \leq [Ge/N] \leq 0.83$,
the nitrogen density [N] satisfies the relationship $1.00 \times 10^{19}/cm^3 \leq [N] \leq 1.00 \times 10^{20}/cm^3$,
the germanium density [Ge] satisfies the relationship $1.70 \times 10^{18}/cm^3 < [Ge] < 1.60 \times 10^{20}/cm^3$, and the n-type SiC single crystal has a resistivity of 10 mΩ·cm or lower, and the same threading dislocation density level as the seed crystal substrate.

2. A method for producing the n-type SiC single crystal of claim 1, the method comprising:
contacting the SiC seed crystal substrate with a Si—C solution having a temperature gradient such that the temperature decreases from the interior of the solution toward the surface of the solution, to cause crystal growth of the n-type SiC single crystal,
adding a nitride and germanium metal to the Si—C solution, and
growing the n-type SiC single crystal containing germanium and nitrogen, and
wherein the density ratio of the germanium and the nitrogen [Ge/N] satisfies the relationship $0.24 \leq [Ge/N] \leq 0.83$,
the nitrogen density [N] satisfies the relationship $1.00 \times 10^{19}/cm^3 \leq [N] \leq 1.00 \times 10^{20}/cm^3$, and
the germanium density [Ge] satisfies the relationship $1.70 \times 10^{18}/cm^3 < [Ge] < 1.60 \times 10^{20}/cm^3$.

3. The method according to claim 2, wherein the nitride is at least one selected from the group consisting of chromium nitride, silicon nitride, germanium nitride, titanium nitride and nickel nitride.

4. The method according to claim 2, wherein the amount of the nitride added is 0.12 at % or greater in terms of nitrogen atoms, based on the total amount of the Si—C solution containing nitrogen and germanium.

5. The method according to claim 2, wherein the surface temperature of the Si—C solution is 1800 to 2200° C.

6. The method according to claim 3, wherein the amount of the nitride added is 0.12 at % or greater in terms of nitrogen atoms, based on the total amount of the Si—C solution containing nitrogen and germanium.

7. The method according to claim 3, wherein the surface temperature of the Si—C solution is 1800 to 2200° C.

8. The method according to claim 4, wherein the surface temperature of the Si—C solution is 1800 to 2200° C.

* * * * *